(12) United States Patent
Sakakieda et al.

(10) Patent No.: US 8,389,875 B2
(45) Date of Patent: Mar. 5, 2013

(54) INSTALLATION STRUCTURE OF (OUTDOOR) COMMUNICATION EQUIPMENT AND INSTALLATION METHOD THEREOF

(75) Inventors: Takayuki Sakakieda, Fukushima (JP); Goro Suemitsu, Tokyo (JP); Seiji Hamano, Tokyo (JP)

(73) Assignees: NEC Corporation, Tokyo (JP); NEC Wireless Networks, Ltd., Fukushima (JP); NEC Engineering, Ltd., Tokyo (JP)

( * ) Notice: Subject to any disclaimer, the term of this patent is extended or adjusted under 35 U.S.C. 154(b) by 170 days.

(21) Appl. No.: 12/275,928

(22) Filed: Nov. 21, 2008

(65) Prior Publication Data

US 2009/0134295 A1    May 28, 2009

(30) Foreign Application Priority Data

Nov. 28, 2007    (JP) .................................. 2007-307509

(51) Int. Cl.
*H05K 7/14* (2006.01)
(52) U.S. Cl. ........................................ 174/535; 361/747
(58) Field of Classification Search .................. 174/535, 174/541; 455/575.1; 248/231.9, 231.91; 361/747
See application file for complete search history.

(56) References Cited

U.S. PATENT DOCUMENTS

| | | | | |
|---|---|---|---|---|
| 5,020,151 A | * | 5/1991 | Sampei et al. | 455/345 |
| 5,036,427 A | * | 7/1991 | Krom et al. | 361/609 |
| 5,206,796 A | * | 4/1993 | Thompson et al. | 361/818 |
| 5,216,904 A | * | 6/1993 | Isaki | 70/58 |
| 5,530,620 A | * | 6/1996 | Sangveraphunsiri | 361/679.33 |
| 5,741,055 A | * | 4/1998 | Chen | 312/348.6 |
| 5,823,496 A | * | 10/1998 | Foley et al. | 248/314 |
| 6,373,698 B1 | * | 4/2002 | Christensen | 361/695 |
| 7,630,212 B2 | * | 12/2009 | Fan et al. | 361/798 |
| 8,070,242 B2 | * | 12/2011 | Makabe | 312/223.1 |

(Continued)

FOREIGN PATENT DOCUMENTS

| | | |
|---|---|---|
| CN | 2792104 Y | 6/2006 |
| JP | 51-107002 A | 9/1976 |

(Continued)

OTHER PUBLICATIONS

Registered Japanese Utility Model No. 3003910, published Aug. 24, 1994 (Japanese Utility Model Application No. Hei06-6698), together with an English-language abstract.

(Continued)

*Primary Examiner* — Hung Ngo
(74) *Attorney, Agent, or Firm* — Scully, Scott, Murphy & Presser, PC

(57) ABSTRACT

To provide an installation structure and an installation method of a communication equipment to reduce a number of components of the equipment and make the installation work easy. A communication equipment and an installation structure of the communication equipment to be installed, e.g., outdoors is provided. A handle for carrying the communication equipment also serves as a fixation component of the communication equipment. A method for installation of a communication equipment comprises providing an inclined portion formed at a part of bottom surface of a communication equipment and keeping the communication equipment in a forward-inclined position temporarily with the assistance of the inclined shape portion when the communication equipment is set on a fixation mount to fix the communication equipment preparatory to installation.

10 Claims, 6 Drawing Sheets

U.S. PATENT DOCUMENTS

| | | | | |
|---|---|---|---|---|
| 2002/0141162 | A1* | 10/2002 | Inman | 361/724 |
| 2002/0173278 | A1* | 11/2002 | Fritz et al. | 455/90 |
| 2004/0017651 | A1* | 1/2004 | Gan et al. | 361/685 |
| 2009/0134296 | A1* | 5/2009 | Odishoo | 248/231.91 |
| 2009/0257198 | A1* | 10/2009 | Rogers et al. | 361/726 |

FOREIGN PATENT DOCUMENTS

| | | |
|---|---|---|
| JP | A05-289422 | 11/1993 |
| JP | P2002-9455 A | 1/2002 |
| JP | 2002-111235 | 4/2002 |

OTHER PUBLICATIONS

Office Action dated Mar. 21, 2012 received from the Japanese Patent Office from related Japanese Application No. 2007-307509, together with a partial English-language translation.

Chinese Official Action mailed Jul. 29, 2011 in corresponding Chinese Patent Application No. 200810180733.2 together with a Japanese translation and an English language translation of the Japanese translation of the Chinese Official Action.

\* cited by examiner (A)

MAGNIFICATION (A)

MAGNIFICATION (B)

INSTALLATION STRUCTURE OF (OUTDOOR) COMMUNICATION EQUIPMENT AND INSTALLATION METHOD THEREOF

REFERENCE TO RELATED APPLICATION

This application is based upon and claims the benefit of the priority of Japanese patent application No. 2007-307509, filed on Nov. 28, 2007, the disclosure of which is incorporated herein in its entirety by reference thereto.

TECHNICAL FIELD

The present invention relates to an installation structure of a communication equipment and an installation method of the equipment, and particularly relates to an installation structure of an outdoor communication equipment and an installation method of the equipment installed at a place to be difficult to install such as a high elevation place.

BACKGROUND

A rapid development of the communication business in these days requires a necessity to install a lot of communication equipments at narrow outdoor places, on the top of a pylon tower, for example. Therefore, a simple and reliable installation structure and installation method of the communication equipment is required to install the communication equipment in such a narrow area.

When installing the communication equipment on a pylon or wall at a high elevation, a worker has to install the communication equipment with holding the communication equipment due to its narrow working space. As a result, the installation work becomes insecure and it may cause a breakage of the equipment.

A structure of a communication equipment is disclosed in Patent Document 1, which has a main body and a radiator and these parts can be combined by a guide pin and a handle easily.
[Patent Document 1]
JP Patent Kokai Publication No. JP-2002-111235A

SUMMARY OF THE DISCLOSURE

The entire disclosure of Patent Documents 1 is incorporated herein by reference thereto.

As for a prior art communication equipment used outdoors a structural component for installation and a component (handle) for transportation or carriage are different and separated. Although a handle of the communication equipment is used at the first stage of the installation work of the equipment, it is not necessary after that, and therefore it should be deleted considering the installation work at a narrow area such as a top of the pylon. However, the handle itself is a necessary component for handling efficiency and cannot be deleted.

Until now there is a problem that the installation work of the communication equipment in a narrow space causes much load for a worker because the worker has to hold the communication equipment during the installation work and sometimes causes a breakage of the equipment, and this problem is not solved yet.

It is an object of the present invention to provide an installation structure and an installation method of a communication equipment to reduce a number of the components of the equipment and make the installation work easy.

According to a first aspect of the present invention, there is provided an installation structure of a communication equipment, e.g., to be installed outdoors. A handle for carrying the communication equipment also serves as a fixation component of the communication equipment.

The handle for carrying the communication equipment preferably comprises a hole for a fixation screw at a position corresponding to a screw fixation portion provided on a fixation mount to fix the communication equipment.

The communication equipment preferably comprises an inclined shape portion formed at a part of the bottom surface of the communication equipment to keep the communication equipment in a forward-inclined position temporarily when the communication equipment is set on the fixation mount preparatory to installation.

A profile of the inclined shape portion of the communication equipment is preferably linear or curved.

According to a second aspect of the present invention, there is provided a communication equipment to be installed outdoors. A handle for carrying the communication equipment also serves as a fixation component of the communication equipment.

The handle for carrying the communication equipment preferably comprises a hole for a fixation screw at a position corresponding to the screw fixation portion provided on a fixation mount to fix the communication equipment.

The communication equipment preferably comprises an inclined shape portion formed at a part of the bottom surface of the communication equipment to keep the communication equipment in a forward-inclined position temporarily when the communication equipment is set on the fixation mount preparatory to installation.

A profile of the inclined shape portion of the communication equipment is preferably linear or curved.

According to a third aspect of the present invention, there is provided a method for installation of a communication equipment, e.g., to be installed outdoors. The method comprises: providing an inclined shape portion formed at a part of the bottom surface of the communication equipment; and keeping the communication equipment in a forward-inclined position temporarily with the assistance of the inclined shape portion when the communication equipment is set on a fixation mount to fix the communication equipment preparatory to installation.

The meritorious effects of the present invention are summarized as follows. A first effect of the present invention is to reduce a number of components of the equipment. The reason is that the handle has a function for carrying the communication equipment and a function to fix the communication equipment on the fixation mount.

A second effect of the present invention is to make the installation work easy. The reason is that an installation worker can install the communication equipment without holding the equipment temporarily because the equipment can be inclined to the fixation mount stably with the assistance of the inclined shape portion formed at a part of the bottom surface of the communication equipment as a contact portion with the fixation mount of the equipment.

PREFERRED MODES

According to an aspect of the present invention, a handle of a communication equipment to be installed, e.g., at the outdoors, also serves as a fixation component of the communication equipment and the communication equipment can be fixed on a fixation mount of the equipment by the fixation component. A screw fixation such as a screw bolt may be used as a fixation means. In addition, a part of the bottom surface of the communication equipment has an inclined shape and therefore the communication equipment can be set stably (pre-installation state) in a forward-inclined position on the fixation mount temporarily. As a result, the workability of the installation work can be improved. A purpose of the inclined shape portion is to make the communication equipment easy to incline forward. Thus a cross section of the inclined shape portion can be linear, or arc curved to reduce a friction during a pushing step of the equipment. However, a friction resistance enough to keep the forward-inclined position of the communication equipment during the pre-installation state is necessary.

The installation structure of the present invention can be applied to a new communication equipment to install on an already existing fixation mount and applied to a new set of a communication equipment having a fixation handle and a fixation mount corresponding to the fixation handle of the communication equipment.

Exemplary Embodiments

Figure 1:
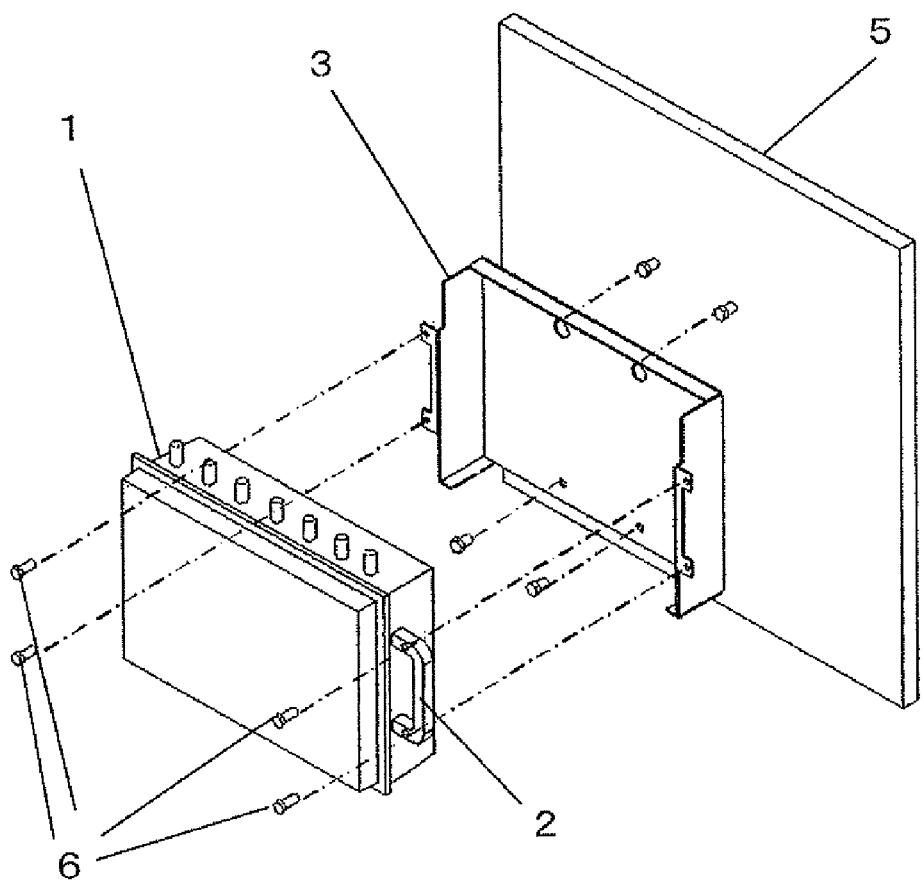
FIG. 1 shows a whole perspective view of a communication equipment and its installation structure according to an exemplary embodiment of the present invention.

FIG. 1 shows a whole perspective view of a communication equipment 1 and its installation structure according to an exemplary embodiment of the present invention. The communication equipment 1 has the determined backside and front-side and the topside and downside for installation. Usually the communication equipment 1 is installed in a vertical (i.e., upright) posture and handles 2 for carriage are provided on both sides of the equipment. When installing the communication equipment 1, the worker grasps both handles 2 of the communication equipment 1 and inserts the communication equipment 1 in a fixation mount 3 fixed on a wall surface 5 in the correct direction and fasten the equipment finally using, e.g., fastening bolt(s) 6 as a fastening means.

Figure 2:
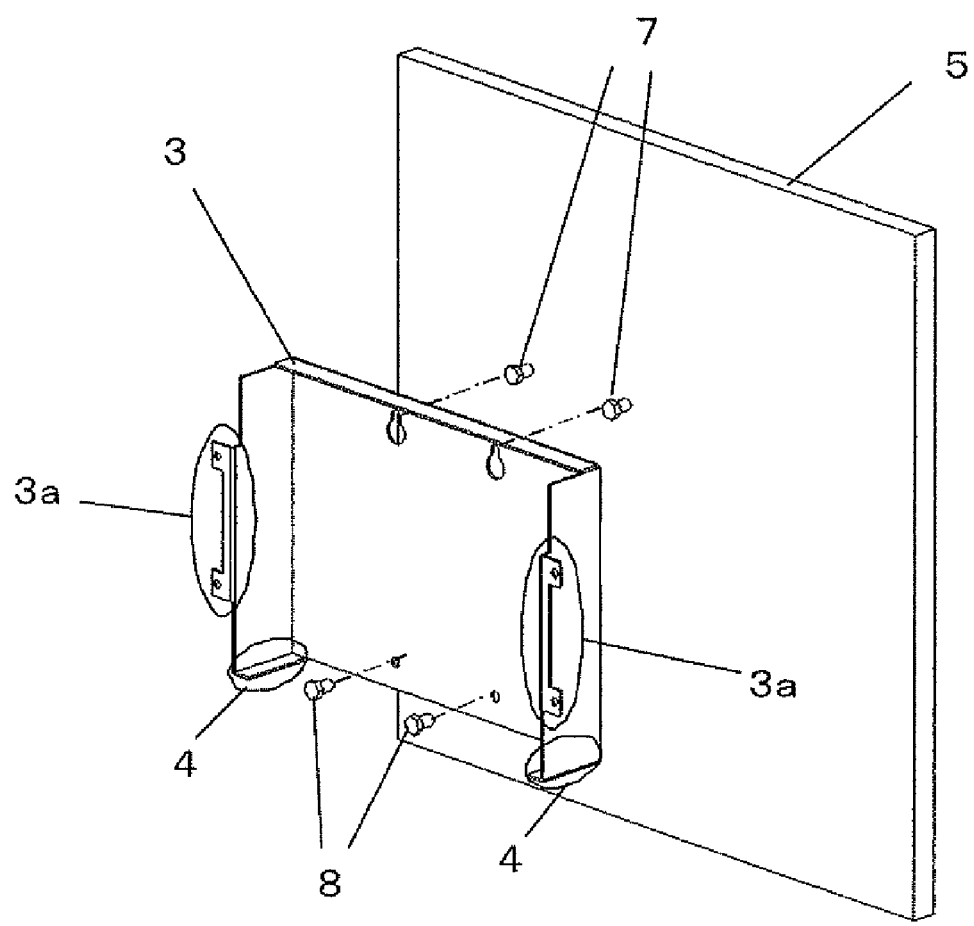
FIG. 2 shows a perspective view of a fixation mount for the equipment to be attached on a wall according to an exemplary embodiment of the present invention.

FIG. 2 shows a perspective view of the fixation mount 3 for the equipment to fix on the wall surface 5. The fixation mount 3 is hooked on upper bolt(s) 7 on the wall surface 5 and then screwed on the surface by the upper bolt(s) 7 and lower bolt(s) 8 in advance of the installation. Alternatively, the fixation mount 3 may be fixed on the wall surface 5 just before the installation work of the communication equipment 1.

As shown in FIG. 2, the fixation mount 3 is formed like a box shape made by a steel plate and comprises a bottom portion 4 to support and rest the communication equipment 1 and a keeping plate (bent portion) 3a to fix the handle 2 by a screw bolt. The keeping plate 3a is a bent portion bent substantially parallel to the wall surface 5 from a distal edge of a side plate of the fixation mount 3 perpendicularly upstanding from the wall surface 5. The keeping plate 3a corresponds to the handle 2 of the communication equipment 1 when fixing the equipment. The keeping plate 3a has a screw fixation portion 9 having a screw, as shown in FIG. 3, whose position corresponds to the position of a fixation (screw) hole 10 of the handle 2 and the communication equipment 1 can be fixed on the screw fixation portion 9 using a screw bolt through the fixation (screw) hole 10.

The handles 2 can be formed in one piece with the communication equipment 1 at both sides of the communication equipment 1 or can be attached as a separate component. The handles 2 are used for carriage and installation work of the communication equipment 1 and protruding from both sides of the equipment 1, and formed U-shaped or rectangular shape for easy gripping. As shown in FIG. 3, the handle 2 is perforated with the fixation (screw) holes 10 to fix the communication equipment 1 on the keeping plate 3a. An inclined shape portion 13 contacting with the bottom portion 4 of the fixation mount 3 is provided at a part of the bottom surface of the communication equipment 1, as described later on.

Figure 3:
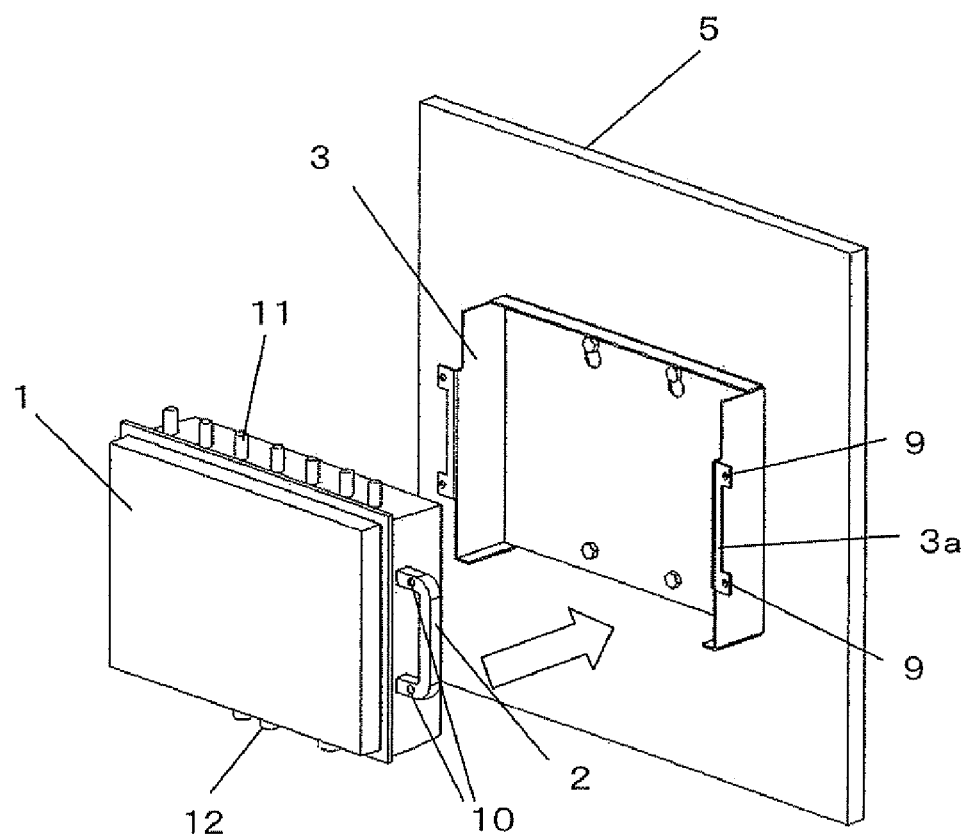
FIG. 3 shows a perspective view of the communication equipment and the fixation mount of the equipment indicating a direction to install the equipment on the fixation mount according to an exemplary embodiment of the present invention.
Figure 4:
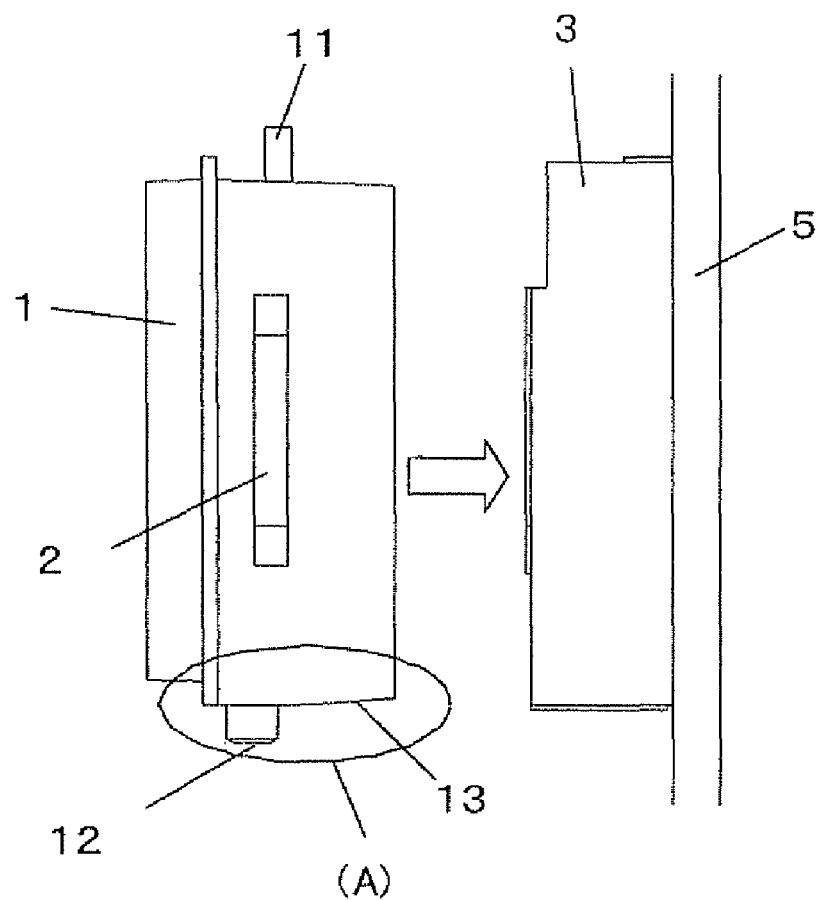
FIG. 4 shows a side view of the communication equipment and the fixation mount of the equipment in FIG. 3.
Figure 4:
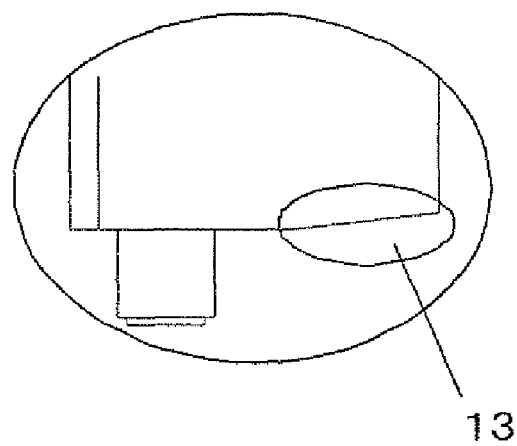

The communication equipment 1 is installed on the fixation mount 3 in a vertical posture, by being moved in a direction of white arrow in FIGS. 3 and 4, as shown in FIGS. 3 and 4. The notched, inclined shape portion 13 is provided at a part of the bottom surface of the communication equipment 1 contacting with the bottom portion 4 of the fixation mount 3 (see magnification (A) of FIG. 4). A purpose of the inclined shape portion 13 is to keep the communication equipment 1 stably in forward-inclined posture (or position) on the fixation mount 3 temporarily as explained later on. Therefore the position of the inclined shape portion 13 may be a half or less portion of the entire bottom of the communication equipment 1 on the forward side in the installation direction. A profile (section) of the inclined shape portion 13 in FIG. 4 is linear; however, it may be an arc curved profile. An area of the inclined shape can be from one edge to another edge of the bottom of the communication equipment 1 or can be only a portion with some margin space where the portion comes into contact with the bottom portion 4 of the fixation mount 3.

Figure 5A:
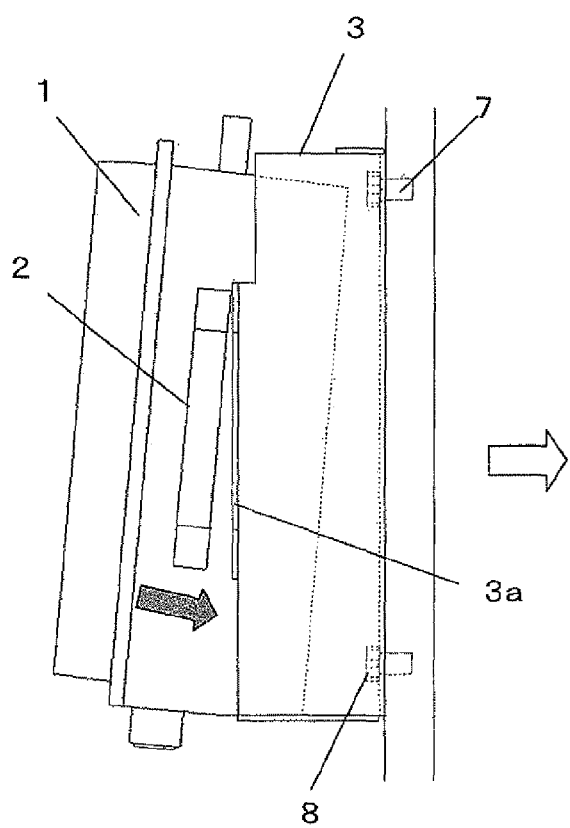
FIG. 5A shows a communication equipment according to an exemplary embodiment of the present invention set on the fixation mount of the equipment in the forward-inclined position temporarily before final installation on the fixation mount.
Figure 5B:
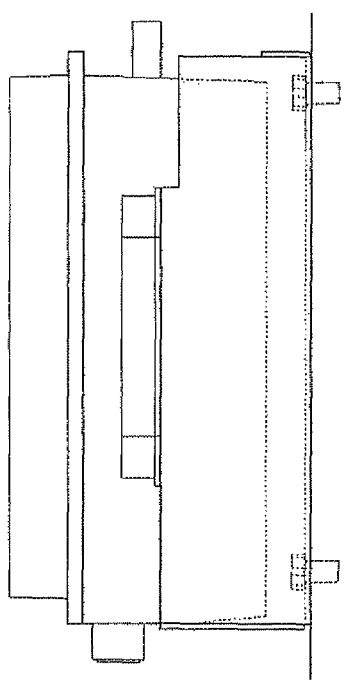
FIG. 5B shows the communication equipment pushed into the fixation mount of the equipment.

When installing the communication equipment 1 on the fixation mount 3, once the equipment 1 is inclined forward by setting the inclined shape portion 13 on the bottom portion 4 of the fixation mount 3, the handle 2 of the communication equipment 1 comes into contact with a seating plate 3a of the fixation mount 3 and the communication equipment 1 is stabilized in its forward-inclined posture (or position); pre-installation state as shown in FIG. 5A. Thus the communication equipment 1 is temporarily held on the fixation mount 3 and the worker can take hands off the communication equipment 1. If there is no inclined shape portion of the equipment, the equipment cannot be forward-inclined enough to keep the position stably. After this a lower portion of the communication equipment 1 is pushed into the fixation mount 3 and then the handle 2 and the keeping plate 3a of the fixation mount 3 contact each other as shown in FIG. 5B.

Figure 6:
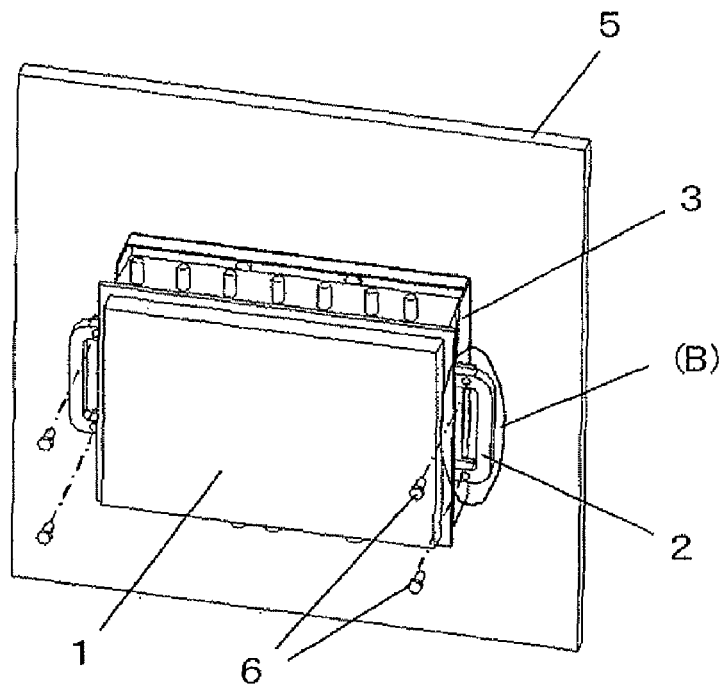
FIG. 6 shows a fixation state of a communication equipment according to an exemplary embodiment on the fixation mount using screw bolts.
Figure 6:
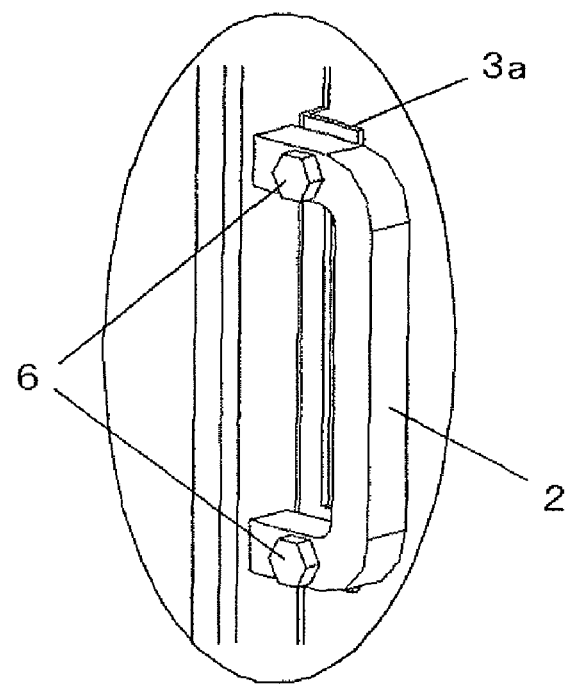

Then the communication equipment 1 is fixed on the fixation mount 3 by screwing the fastening bolts 6 in the screw fixation portions 9 of the keeping plate 3a through the fixation (screw) holes 10 of the handle 2 as shown in FIG. 6.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

What is claimed is:

1. An installation structure of an outdoor communication equipment for installing said outdoor communication equipment, wherein said installation structure is adapted for installing said outdoor communication equipment on a fixation mount and the structure comprising: a handle formed on the outdoor communication equipment for carrying the outdoor communication equipment, wherein said handle is provided with holes, and wherein said outdoor communication equipment is fixed to the fixation mount by using the holes of the handle, and wherein said outdoor communication equipment has an inclined shape portion at a part of a bottom surface of the outdoor communication equipment, the bottom surface being perpendicular to a surface on which the handle is formed.

2. The installation structure of the outdoor communication equipment as defined in claim 1, wherein the handle for carrying the outdoor communication equipment comprises the holes for fixation screws at a position corresponding to a screw fixation portion provided on the fixation mount to fix the outdoor communication equipment.

3. The installation structure of the outdoor communication equipment as defined in claim 1, wherein the inclined shape portion is formed to keep the outdoor communication equipment in a stable forward-inclined position temporarily when the outdoor communication equipment is set on the fixation mount preparatory to installation.

4. The installation structure of the outdoor communication equipment as defined in claim 3, wherein a profile of the inclined shape portion of the outdoor communication equipment is linear or curved.

5. The installation structure of the outdoor communication equipment as defined in claim 1, wherein the handle for carrying the outdoor communication equipment is U-shaped or rectangular shaped for gripping.

6. An outdoor communication equipment comprising: a handle formed on the outdoor communication equipment for carrying the outdoor communication equipment, wherein said handle is provided with holes, and wherein said outdoor communication equipment is mounted to a fixation mount by using the holes of the handle, and wherein said outdoor communication equipment has an inclined shape portion at a part of a bottom surface of the outdoor communication equipment, the bottom surface being perpendicular to a surface on which the handle is formed.

7. The outdoor communication equipment as defined in claim 6, wherein said handle comprises the holes for fixation screws at a position corresponding to the screw fixation portion provided on the fixation mount to fix the outdoor communication equipment.

8. The outdoor communication equipment as defined in claim 6, wherein the inclined shape portion is formed to keep the outdoor communication equipment in a stable forward-inclined position temporarily when the outdoor communication equipment is set on the fixation mount preparatory to installation.

9. The outdoor communication equipment as defined in claim 8, wherein a profile of the inclined shape portion of the outdoor communication equipment is linear or curved.

10. The outdoor communication equipment as defined in claim 6, wherein said handle is U-shaped or rectangular shaped for gripping.

* * * * *